United States Patent [19]

Lauriello

[11] Patent Number: 4,472,678
[45] Date of Patent: Sep. 18, 1984

[54] TEST APPARATUS FOR CIRCUITS HAVING A MULTIPLEX INPUT/OUTPUT TERMINAL INCLUDING A LOAD CONNECTED TO THE TERMINAL TOGETHER WITH CIRCUITRY FOR MONITORING THE CURRENT FLOW THROUGH THE LOAD WHEN INPUTTING A SIGNAL TO THE TERMINAL

[75] Inventor: Alfred F. Lauriello, Plano, Tex.
[73] Assignee: Mostek Corporation, Carrollton, Tex.
[21] Appl. No.: 292,918
[22] Filed: Aug. 10, 1981
[51] Int. Cl.³ .................... G01R 15/12; G01R 31/28
[52] U.S. Cl. .................................................. 324/73 R
[58] Field of Search ........... 324/73 R, 73 PC, 73 AT, 324/51; 371/25

[56] References Cited

U.S. PATENT DOCUMENTS 3,922,537 11/1975 Jackson ........................ 324/73 R X
4,045,733 8/1977 Dolan et al. .................. 324/73 R X Primary Examiner—Gerard R. Strecker
Assistant Examiner—Warren S. Edmonds

[57] ABSTRACT

A test circuit (10) provides high and low reference voltages to a circuit (92) under test. A load (52) is connected to a multiplexed terminal (90) of circuit (92). A current source transistor (48) and a current sink transistor (132) are connected to provide current through load (52). A feedback network is connected to the current source transistor (48) and a second feedback network is connected to the current sink transistor (132). The feedback signals are compared to the reference voltages to generate control signals for driving the multiplexed terminal (90) accurately to the desired reference voltage. When the circuit (92) under test generates logic signals the load (52) sources or sinks the appropriate current depending upon the voltage states generated by the circuit (92). The voltage states generated at the multiplexed terminal (90) are transmitted through a buffer (148) to an output terminal (156). Thus, the load (52) is connected to the multiplexed terminal (90) at all times to provide the correct load for circuit (92) but does not degrade the reference voltages applied to terminal (90) due to the operation of the feedback networks.

12 Claims, 2 Drawing Figures

TEST APPARATUS FOR CIRCUITS HAVING A MULTIPLEX INPUT/OUTPUT TERMINAL INCLUDING A LOAD CONNECTED TO THE TERMINAL TOGETHER WITH CIRCUITRY FOR MONITORING THE CURRENT FLOW THROUGH THE LOAD WHEN INPUTTING A SIGNAL TO THE TERMINAL

TECHNICAL FIELD

The present invention pertains to electronic test circuits and more particularly to such test circuits which are used for testing integrated circuits in which one or more of the circuit terminals are multiplexed to both transmit and receive logic states.

BACKGROUND OF THE INVENTION

Integrated circuits such as, for example, random access memories, must be functionally tested to determine the characteristics of the circuit. The characteristics include the voltage levels at which the circuit will operate and the speeds at which the circuit will perform.

Such testing has previously been performed by providing variable amplitude reference voltages to the input terminal of a circuit while monitoring an output terminal to determine the response of the circuit. However, many memory circuits now in use multiplex a particular terminal to both receive and transmit logic states. These circuits typically have a high input impedance when the circuit is in the receive mode but have a low output impedance when the circuit is in the transmit mode. When the circuit is transmitting logic states to the testing apparatus, a load must be provided in order for the circuit to properly function. But, when a load is connected to the multiplexed terminal when it is receiving logic states, the driving apparatus will be excessively loaded which will in turn alter the reference voltage provided to the circuit. There have been previous circuits designed to switch the load in and out of the testing circuit depending upon the operating mode of the circuit under test. This approach, however, has not been completely successful since the switching generates timing problems, voltage aberrations and signal transients which produce unwanted noise.

In view of the need to test circuits having multiplexed terminals and the problems incurred in such testing, there exists a need for a method and apparatus for testing a circuit having multiplexed input/output terminals to provide stable and accurate reference voltages without loading the test apparatus while also providing the required load for the circuit under test.

SUMMARY OF THE INVENTION

A selected embodiment of the present invention comprises an apparatus for testing a circuit which has a multiplex input/output terminal. The apparatus includes a load which is connected to the multiplex terminal and circuitry for sourcing and sinking current for the load. Circuitry is provided for monitoring the current flow through the load. A control and driver circuit is connected to receive a first reference voltage and functions in response to the current flow through the load for driving the multiplex terminal to the first reference voltage state upon receipt of a first driver signal. Further control and driver circuitry is provided for receiving a second reference voltage and operating in response to the current flow through the load to drive the multiplex terminal to a second reference voltage upon receipt of a second driver signal.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
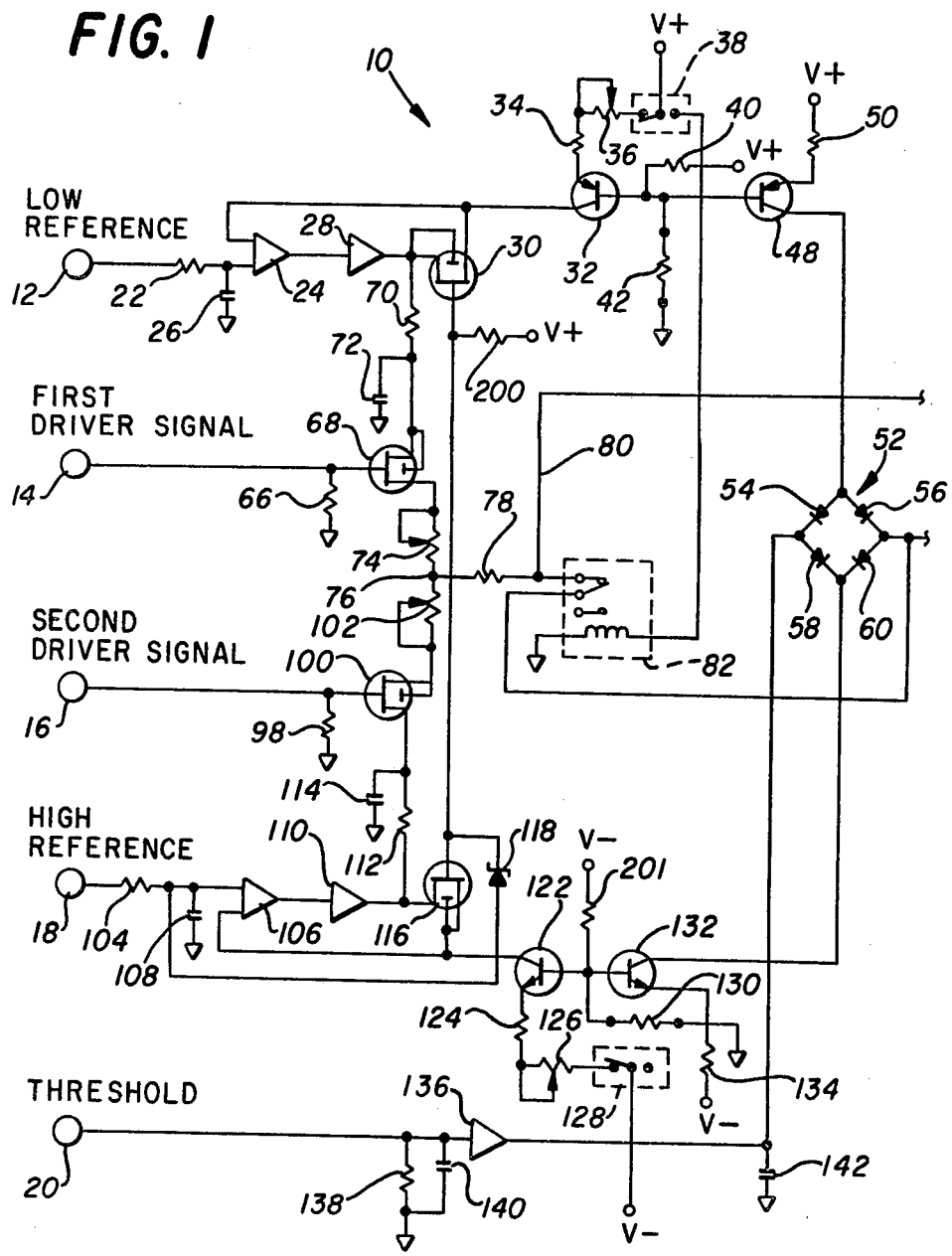
FIGS. 1 and 2 are a schematic diagram of a test apparatus in accordance with the present invention for testing a circuit which has a multiplex input/output terminal.
Figure 2:
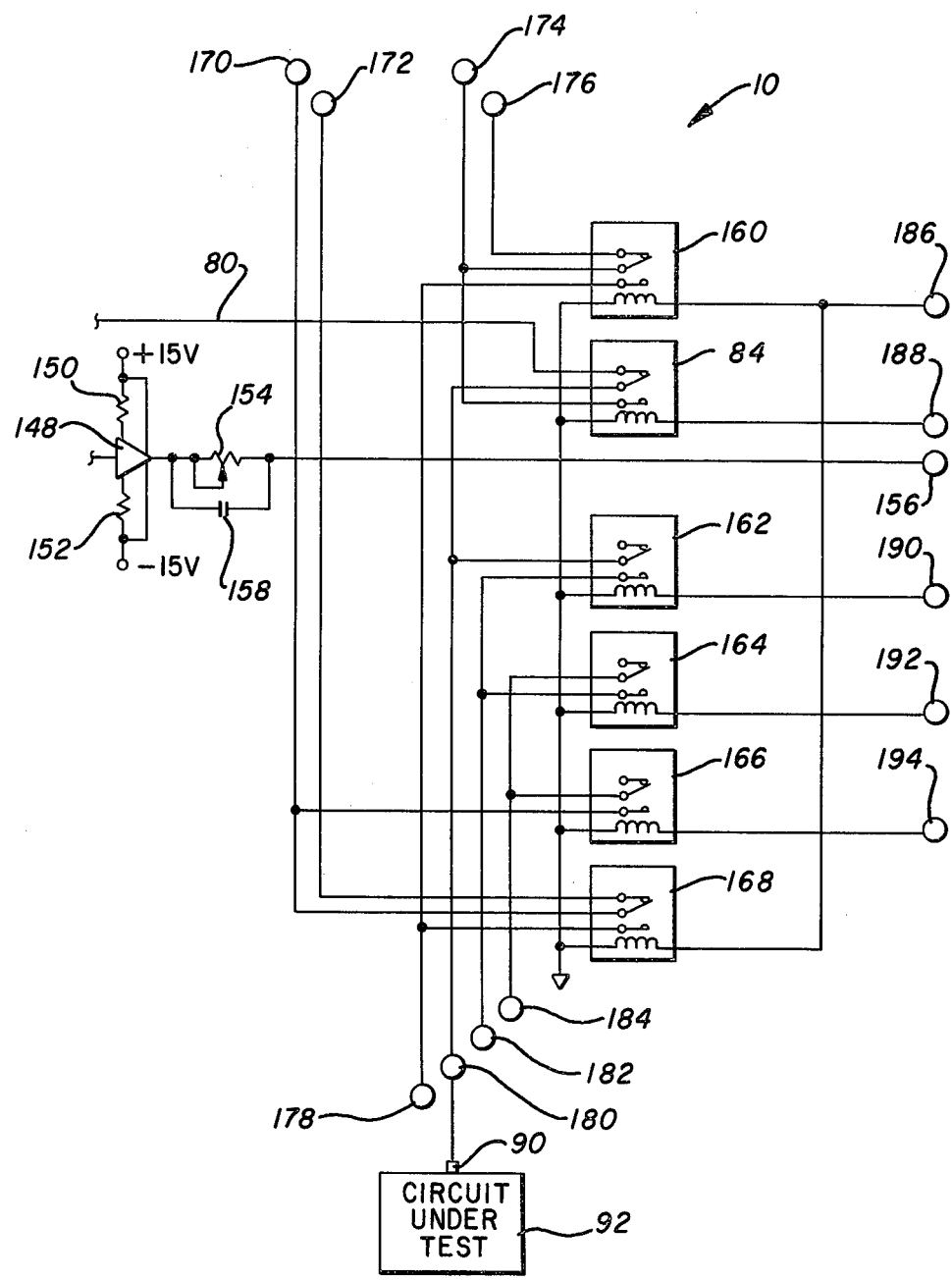

Referring to FIGS. 1 and 2 there is illustrated a schematic diagram of a test circuit which is designated generally by the reference numeral 10. The inputs to circuit 10 are a low reference voltage at a terminal 12, a first driver signal at a terminal 14, a second driver signal at a terminal 16, a high reference voltage at a terminal 18 and a threshold voltage at a terminal 20.

The low reference voltage is transmitted through a resistor 22 to the noninverting input of a differential amplifier 24. A capacitor 26 is connected between the noninverting input terminal of amplifier 24 and ground. The output of amplifier 24 is provided to the input of an amplifier 28.

The output terminal of amplifier 28 is connected to the source terminal of a transistor 30. The drain terminal of transistor 30 is connected to the inverting input of amplifier 24. The drain terminal of transistor 30 is further connected to the collector terminal of a transistor 32. The emitter terminal of transistor 32 is connected to a resistor 34 which is serially connected to a potentiometer 36. The potentiometer is in turn serially connected to a switch 38 which has the switch arm thereof connected to a first power terminal V+. The base terminal of transistor 32 is connected to the junction of bias resistors 40 and 42. Resistor 40 is connected to the first power terminal V+ and resistor 42 is connected to ground.

The base terminal of transistor 32 is further connected to the base terminal of a transistor 48 which has the emitter terminal thereof connected through a resistor 50 to the first power terminal V+.

The collector terminal of transistor 48 is connected to a diode bridge load 52. Load 52 comprises diodes 54, 56, 58 and 60. The collector terminal of transistor 48 is connected to the anode terminals of diodes 54 and 56. The cathode terminals of diodes 58 and 60 are connected in common. The cathode terminal of diode 54 is connected to the anode terminal of diode 58 and the cathode terminal of diode 56 is connected to the anode terminal of diode 60.

A resistor 66 is connected between terminal 14 and ground. The first driver signal is transmitted through terminal 14 to the gate terminal of a transistor 68. The source terminal of transistor 68 is connected to a resistor 70 which is in turn connected to the output of amplifier 28. A capacitor 72 is connected between the drain terminal of transistor 68 and ground. The drain terminal of transistor 68 is connected through a potentiometer 74 to a node 76.

Node 76 is connected to the first terminal of a resistor 78 which has a second terminal thereof connected to a node 80. Node 80 is connected through switch 82 to the junction of diodes 56 and 60. Node 80 is also connected through switch 84 to a terminal 90 of a circuit 92.

Circuit 92 is of the type which multiplexes terminal 90. Logical information is received by circuit 92 through terminal 90 when circuit 92 is in the receive mode. Circuit 92 transmits logic states through terminal 90 when circuit 92 is in the transmit mode. Terminal 90 is thus a multiplexed terminal.

A resistor 98 is connected between the terminal 16 and ground. The second driver signal is transmitted through terminal 16 to the gate terminal of a transistor 100. The source terminal of transistor 100 is connected through a potentiometer 102 to node 76.

The high reference voltage is transmitted from terminal 18 through a resistor 104 to the noninverting input of a differential amplifier 106. A capacitor 108 has a first terminal connected to the junction of resistor 104 and the amplifier 106 and a second terminal connected to ground. The output terminal of amplifier 106 is connected to the input terminal of an amplifier 110. The output terminal of amplifier 110 is connected through a resistor 112 to the drain terminal of transistor 100. A capacitor 114 is connected between the drain terminal of transistor 100 and ground.

The drain terminal of a transistor 116 is connected to the output terminal of amplifier 110. The gate terminal of transistor 116 is connected to the gate terminal of transistor 30 and to the first terminal of resistor 200. The second terminal of resistor 200 is connected to the first power terminals V+. The source terminal of transistor 116 is connected to the inverting input of amplifier 106.

A zener diode 118 is connected between the noninverting input of amplifier 106 and the gate terminal of transistor 116 to prevent saturation of transistor 116.

The collector terminal of a transistor 122 is connected to both the noninverting input of amplifier 106 and the source terminal of transistor 116. The emitter terminal of transistor 122 is connected serially through a resistor 124, a potentiometer 126 and a switch 128 to the second power terminal V−. The base terminal of transistor 122 is connected through a resistor 130 to ground.

The base terminal of transistor 122 is further connected to the base terminal of a transistor 132. The emitter terminal of transistor 132 is connected through a resistor 134 to the second power terminal V−. The collector terminal of transistor 132 is connected to the load 52 at the junction of diodes 58 and 60.

A threshold voltage is input through terminal 20 to an amplifier 136. A resistor 138 has a first terminal connected to the input of amplifier 136 and a second terminal grounded. A capacitor 140 is connected in parallel with resistor 138. The output terminal of amplifier 136 is connected to the load 52 at the junction of diodes 54 and 58. A capacitor 142 is connected between the output of amplifier 136 and ground.

Node 80 is connected through switch 82 to the junction of diodes 56 and 60. The junction of these diodes is connected to the input of a high impedance buffer 148. Buffer 148 is connected through a resistor 150 to a +15 volt supply. Buffer 148 is further connected through a resistor 152 to a −15 volt supply. The +15 volt and −15 volt supplies are also directly connected to buffer 148.

The output terminal of buffer 148 is connected to the first terminal of a potentiometer 154 which has a second terminal thereof connected to an output terminal 156. A capacitor 158 is connected in parallel with potentiometer 154.

Additional switches 160, 162, 164, 166 and 168 are provided for connecting terminals 170, 172, 174 and 176 to terminals 178, 180, 182 and 184. Switches 160, 84, 162, 164 and 166 are activated respectively by signals received at terminals 186, 188, 190, 192 and 194. Switch 168 is activated by a signal received through terminal 186. The terminals 178-184 are provided for making additional connections to additional terminals of the circuit 92.

Operation of the test circuit 10 is now described in reference to FIGS. 1 and 2. The circuit 92 which is to be tested is typically a random access memory, however, any type of circuit which has a multiplexed terminal can be tested with the test circuit of the present invention. The multiplex terminal 90 is used to receive data states when the circuit 92 is in the receive mode and is utilized to transmit data states when the circuit 92 is in the transmit mode.

Circuit 10 is first described for the circuit 92 functioning in the receive mode. In this mode reference voltages are applied to circuit 92 to determine the marginal voltage operation of the circuit. The reference voltages are provided to circuit 10 and are changed in increments to determine the maximum and minimum operational levels for the circuit 92.

The switches 82 and 84 are set in the position shown while the remaining switches are also set as shown. These switches are operated for carrying out a testing of a group of pins using similar circuitry to that shown herein. No further description of the operation of these switches is required for describing the present invention.

The transistors 68 and 100 are turned on one at a time to supply either a high or a low reference voltage to node 80 which is in turn connected to multiplex terminal 90. A high voltage state at terminal 14 turns transistor 68 on while high voltage state at terminal 16 turns on transistor 100. A low voltage state on either terminal turns off the corresponding transistor. The values of resistor 78 and potentiometers 74 and 102 are selected such that a design impedance, such as 50 ohms, is provided as seen from terminal 80. This impedance takes into account the impedance of the transistors 68 and 100 when they are turned on.

The low reference voltage is input to amplifier 24 which produces an output that is transmitted through amplifier 28. The output of amplifier 28 is combined with the signal which is passed through transistor 30. The combined signals are transmitted through resistor 70 to transistor 68. If transistor 68 is turned on the combined reference signal and return signal from transistor 32 is provided to transistor 68. The combined signal is transmitted through transistor 68 to node 76 and from node 76 to multiplex terminal 90. When this occurs a low reference voltage is applied to terminal 90.

If not for the remainder of circuit 10 the load 52 would draw current from node 76 and reduce the voltage at that node down from the desired reference level. In the present invention current is provided by a current source which is transistor 48. A mirror transistor 32 is connected such that the current flows through transistors 32 and 48 are the same. The collector current from transistor 32 is provided to the inverting input of differential amplifier 24 for reference to the low reference voltage. The difference between these two signals is transmitted through amplifier 28 to transistor 68. A feedback loop extends from the load 52 to the differential amplifier 24.

Transistor 32 is included in circuit 10 to serve as a mirror transistor and is connected such that the current through transistor 32 is equal to the current through transistor 48. This matched current is transmitted through transistors 30 and 68 to be supplied to the load 52.

Transistor 132 functions in a similar manner to that of transistor 48 but serves as a current sink. Transistor 122 is a mirror transistor to transistor 132 wherein the currents through transistors 122 and 132 are equal. Transistor 122 serves to monitor the current which is drawn from the load 52. The current from transistor 122 is transmitted through transistors 116 and 100 for supply to the load 52.

The low reference voltage is supplied to pin 90 when the first driver signal is activated and the high reference voltage is supplied to pin 90 when the second driver signal is activated.

The feedback loop is provided to supply the necessary current to load 52 such that the reference voltage is accurately provided to terminal 90. This is accomplished by the feedback loop action wherein the output of transistor 32 is provided for comparison with the low reference voltage and the output of transistor 122 is provided to amplifier 106 for comparison to the high reference voltage. The outputs of the amplifiers serve to balance the corresponding circuit such that the correct reference voltage is supplied to the terminal 90.

The load 52 essentially serves as a divider for providing current to or receiving current from the circuit under test. A resistor network can be utilized in place of the diode network shown.

In a second mode of operation of circuit 10, the circuit 92 under test is in the transmit mode. In this mode the circuit 92 must be provided with a load in order for the circuit to properly function in accordance with its design parameters. The load 52 is provided to serve this function.

The first and second driver signals are in a low state throughout the time that test circuit 92 is in the transmit mode. In this condition transistors 68 and 100 are turned off and test circuit 92 is loaded only by load 52.

The current source transistor 48 and current sink transistor 132 are provided to source or sink the appropriate current dictated by the design parameters of circuit 92. A threshold voltage is provided through terminal 20 and transmitted to load 52 by the buffer 136. When the voltage state generated by circuit 92 at pin 90 is above the threshold voltage, the load 52 provides a source current determined by adjusting resistor 42. When the voltage state generated by circuit 92 at pin 90 is below the threshold voltage, the load 52 provides a sink current determined by adjusting resistor 130.

The output state of circuit 92 is transmitted to node 80 which is an input to buffer 148. Buffer 148 has a high impedance and therefore does not provide any load for curcuit 92. However, the state of pin 90 is transmitted through buffer 148 and provided to the output terminal 156.

In summary the operation of circuit 10 provides high and low reference voltage states to terminal 90 of circuit 92. The load 52 is connected to terminal 90 at all times. The loading provided by circuit 52 is compensated by feedback networks which provide the appropriate drive to ensure that the reference voltage levels are provided at the multiplexed terminal 90. This occurs when the circuit 92 is receiving external signals. When circuit 92 is generating signals the load 52 supplies the appropriate current source or sink depending upon the voltage state generated by circuit 92 at terminal 90. The voltage state thus generated is transmitted through buffer 148 to output terminal 156. Thus, the correct loading for circuit 92 is provided by load 52 and load 52 is never switched in or out of the circuit.

Although one embodiment of the invention has been illustrated in the accompanying Drawings and described in the foregoing Detailed Description, it will be understood that the invention is not limited to the embodiment disclosed, but is capable of numerous rearrangements, modifications and substitutions without departing from the scope of the invention.

I claim:

1. Apparatus for testing a circuit having a multiplexed input/output terminal, comprising:
    a load connected to said mulitplexed terminal;
    means coupled to said load for sourcing and sinking current for said load when said terminal is being tested as an output terminal;
    means coupled to said load for monitoring the current flow through said load when said terminal is being tested as in input terminal;
    means coupled to said means for monitoring which responsive to a first reference voltage and responsive to said means for monitoring for driving said multiplexed terminal to said first reference voltage upon receipt of a first driver signal when said terminal is being tested as in input terminal; and
    means coupled to said means for monitoring which is responsive to a second reference voltage and responsive to said means for monitoring for driving said multiplexed terminal to said second reference voltage upon receipt of a second driver signal when said terminal is being tested as an input terminal.

2. The apparatus recited in claim 1 wherein said load comprises a diode bridge.

3. The apparatus recited in claim 1 wherein said means for sourcing and sinking current comprises:
    a first transistor having the base terminal thereof connected to receive a bias voltage, the emitter terminal thereof coupled to a first power terminal and the collector terminal thereof connected to a first terminal of said load; and
    a second transistor having the base terminal thereof connected to receive a bias voltage, the emitter terminal thereof coupled to a second power terminal and the collector terminal thereof connected to a second terminal of said load.

4. The apparatus recited in claim 3 wherein said means for monitoring comprises:
    a first current mirror transistor having the base terminal thereof connected to said first transistor such that the current flow through said first mirror transistor is equal to the current flow through said first transistor; and
    a second current mirror transistor having the base terminal thereof connected to said second transistor such that the current flow through said second mirror transistor is equal to the current flow through said second transistor.

5. The apparatus recited in claim 1 wherein said means connected to receive a first reference voltage comprises:
    means for comparing said first reference voltage to a first output signal of said means for monitoring to generate a first control signal;

means for combining said first output signal with said first control signal to produce a first driving signal; and means responsive to the state of said first driver signal for routing said first driving signal to said multiplexed terminal.

6. The apparatus recited in claim 1 wherein said means connected to receive a second reference voltage comprises:

means for comparing said second reference voltage to a second output signal of said means for monitoring to generate a second control signal;

means for combining said second output signal with said second control signal to produce a first driving signal; and means responsive to the state of said second driver signal for routing said second driving signal to said multiplexed terminal.

7. The apparatus recited in claim 1 including a high input impedance buffer having the input thereof connected to said multiplexed terminal and the output thereof connected to an output terminal for receiving the output voltage states of said circuit.

8. Apparatus for testing a circuit having a multiplexed input/output terminal, comprising:

a diode bridge comprising four diodes having the anode terminals of first and second diodes connected to a first terminal, the cathode terminal of third and fourth diodes connected to a second terminal, the cathode of said first diode and the anode connected to a second terminal, the cathode of said first diode and the anode of said third diode connected to a third terminal and the cathode of said second diode and the anode of said fourth diode connected to a fourth terminal, said fourth terminal connected to said multiplexed terminal;

a first transistor having the base terminal thereof connected to receive a bias voltage, the emitter terminal thereof coupled to a first power terminal and the collector terminal thereof connected to said first terminal of said bridge;

a second transistor having the base terminal thereof connected to receive a bias voltage, the emitter terminal thereof coupled to a second power terminal and the collector terminal thereof connected to said second terminal of said bridge;

a first current mirror transistor having the base terminal thereof connected to said first transistor and the emitter terminal thereof coupled to said first power terminal such that the current flow through said first mirror transitor is equal to the current flow through said first transistor;

a second current mirror transistor having the base terminal thereof connected to said second transistor and the emitter terminal thereof coupled to said second power terminal such that the current flow through said second mirror transistor is equal to the current flow through said second transistor;

means coupled to said first current mirror transitor for comparing a first reference voltage to a first output signal of said first current mirror transistor to generate a first control signal;

means coupled to said first current mirror transistor for combining said first output signal with said first control signal to produce a first driving signal;

means coupled to said means for combining said first output signal and responsive to the state of a first driver signal for routing said first driving signal to said multiplexed terminal;

means coupled to said second current mirror transistor for comparing a second reference voltage to a second output signal of said means for monitoring to generate a second control signal;

means coupled to said second current mirror transistor for combining said second output signal with said second control signal to produce a first driving signal; and means coupled to said means for combining said second output signal and responsive to the state of a second driver signal for routing said second driving signal to said multiplexed terminal.

9. The apparatus recited in claim 8 including a high input impedance buffer having the input thereof connected to said mulitplexed terminal and the output thereof connected to an output terminal for receiving the output voltage states of said circuit.

10. Apparatus for testing a circuit having a multiplexed input/output terminal, comprising:

a four diode bridge having first, second, third and fourth terminals, a first diode having the anode and cathode terminals thereof connected respectively between said first and third terminals, a second diode having the anode and cathode terminals thereof connected respectively between said first and fourth terminals, a third diode having the anode and cathode terminals thereof connected respectively between said third and second terminals and a fourth diode having the anode and cathode terminals thereof connected respectively between said fourth and second terminals, said multiplexed terminal connected to said fourth terminal;

a first transistor having the base terminal thereof connected to receive a bias voltage, the emitter terminal thereof coupled to a first power terminal and the collector terminal thereof connected to said first terminal of said bridge;

a second transistor having the base terminal thereof connected to receive a bias voltage, the emitter terminal thereof coupled to a second power terminal, and the collector terminal thereof connected to said second terminal of said bridge;

a third transistor having the base terminal thereof connected to the base terminal of said first transistor and the emitter terminal thereof coupled to said first power terminal;

a fourth transistor having the base terminal thereof connected to the base terminal of said second transistor and the emitter terminal thereof coupled to said first power terminal;

a fifth transistor having the gate terminal thereof connected to said first power terminal and the drain terminal thereof connected to the collector terminal of said third transistor;

a sixth transistor having the gate terminal thereof connected to said first power terminal and the drain terminal thereof connected to the collector terminal of said fourth transistor;

a seventh transistor having the gate terminal thereof connected to receive a first driver signal, the drain terminal thereof connected to the source terminal of said fifth transistor and the source terminal thereof coupled to said multiplexed terminal;

an eighth transistor having the gate terminal thereof connected to receive a second driver signal, the drain terminal thereof connected to the source terminal of said sixth transistor, and the source terminal thereof coupled to said multiplexed terminal;

a first differential amplifier having a first reference voltage provided to a first input terminal thereof and the collector terminal of said third transistor connected to the second input terminal thereof and the output of said first amplifier coupled to the source terminal of said fifth transistor and the drain terminal of said seventh transistor; and a second differential amplifier having a second reference voltage provided to a first input terminal thereof and the collector terminal of said fourth transistor connected to the second input terminal thereof and the output of said second amplifier coupled to the source terminal of said fifth transistor and the drain terminal of said eighth transistor.

11. The apparatus recited in claim 10 including a high input impedance buffer having the input terminal thereof connected to said multiplex terminal and the output thereof connected to an output terminal for receiving the output voltage of said circuit.

12. A method for testing a circuit having a multiplexed input/output terminal, comprising the steps of:
connecting a load to said multiplexed terminal;
providing a current source and current sink for said load;
monitoring the current flow through said load;
receiving a first reference voltage and driving said multiplexed terminal to said first reference voltage in response to the current flow through said load, said multiplexed terminal driven to said first reference voltage upon receipt of a first driver signal; and
receiving a second reference voltage and driving said multiplexed terminal to said second reference voltage in response to the current flow through said load, said multiplexed terminal driven to said second reference voltage upon receipt of a second driver signal.

* * * * *